April 19, 1966 C. L. EMMERICH 3,247,504

DIGITAL RESOLVER SYSTEM

Filed Oct. 30, 1961 2 Sheets-Sheet 1

INVENTOR.
CLAUDE L. EMMERICH
BY Henry L. Shenier
ATTORNEY

April 19, 1966 C. L. EMMERICH 3,247,504

DIGITAL RESOLVER SYSTEM

Filed Oct. 30, 1961 2 Sheets-Sheet 2

INVENTOR.
CLAUDE L. EMMERICH
BY Henry L. Shenier
ATTORNEY 3,247,504

DIGITAL RESOLVER SYSTEM

Claude L. Emmerich, Scarsdale, N.Y., assignor to United Aircraft Corporation, East Hartford, Conn., a corporation of Delaware Filed Oct. 30, 1961, Ser. No. 148,319
4 Claims. (Cl. 340—347)

My invention relates to a digital resolver system and more particularly to a multipole resolver system which does not require the use of balanced high gain amplifiers in its output circuit.

Many installations require the generation of an extremely accurate indication of the position of a shaft. It is desirable that the indication be in digital form so that it can readily be handled by a digital computer. Devices of the prior art incorporating code wheels for producing a digital representation in response to angular position of a shaft are not satisfactory for many applications. For example, such devices cannot be mounted directly on the gimbals of a stable platform. There are also known devices such as resolvers which can be employed to give a coarse analogue indication of shaft position. Multipole resolvers known as "inductosyns" give a relatively fine indication of shaft position. Such "inductosyns" are described in Childs Patent 2,650,352 or in Childs Patent 2,671,892. It has been suggested that the outputs of these devices can be employed to generate an extremely accurate digital representation of shaft position.

Owing to the fact that the transformation ratio in an inductosyn is very small, high gain amplifiers must be employed in the output circuits of the inductosyn. Not only is this true but also if undesirable errors are to be avoided it is required that the output amplifiers of the inductosyn be balanced with a high degree of accuracy. That is, the output amplifiers must have a gain which is highly stabilized to about one part in one thousand. In order to achieve this result, great difficulties must be overcome and many expensive components must be provided.

I have invented a digital resolver system which eliminates the necessity for providing balanced high gain amplifiers in the output circuits of a multipole resolver. My system is extremely simple and inexpensive for the result achieved thereby. My resolver system permits of the use of higher signal levels with a resultant improvement in signal-to-noise ratio. The output amplifier of my digital resolver system need not have a stabilized gain.

One object of my invention is to provide a digital resolver system for producing an extremely accurate digital representation of shaft position without using balanced high gain amplifiers in the high speed channel of the system.

Another object of my invention is to provide a digital resolver system which does not require the use of balanced high gain amplifiers in the output circuits of a multipole resolver system.

Still another object of my invention is to provide a digital resolver system which is simple and inexpensive to produce.

A further object of my invention is to provide a digital resolver system, the output amplifier of which need not have a stabilized gain.

A still further object of my invention is to provide a digital resolver system having an improved signal-to-noise ratio.

Other and further objects of my invention will appear from the following description.

In general my invention contemplates the provision of a digital multipole resolver system in which I apply respective pulses having magnitudes proportional to the sine and the cosine of an initial shaft angle representation to the sine and cosine windings of the resolver to cause it to produce an output signal having a magnitude proportional to the difference between the initial angle representation and the actual shaft angle and having a sign indicating the direction of the difference. I digitize this difference signal and subtract or add it to the initial angular representation depending upon the direction of the difference to produce a digital output representation of the actual angular position of the resolver shaft.

I have also provided my system with means for ensuring that the power dissipation in my resolver is constant. I have provided a rotor winding which obviates undesirable electromagnetic coupling with the external circuit.

In the accompaning drawings which form part of the instant specification and which are to be read in conjunction therewith and in which like reference numerals are used to indicate like parts in the various views.

Figure 1:
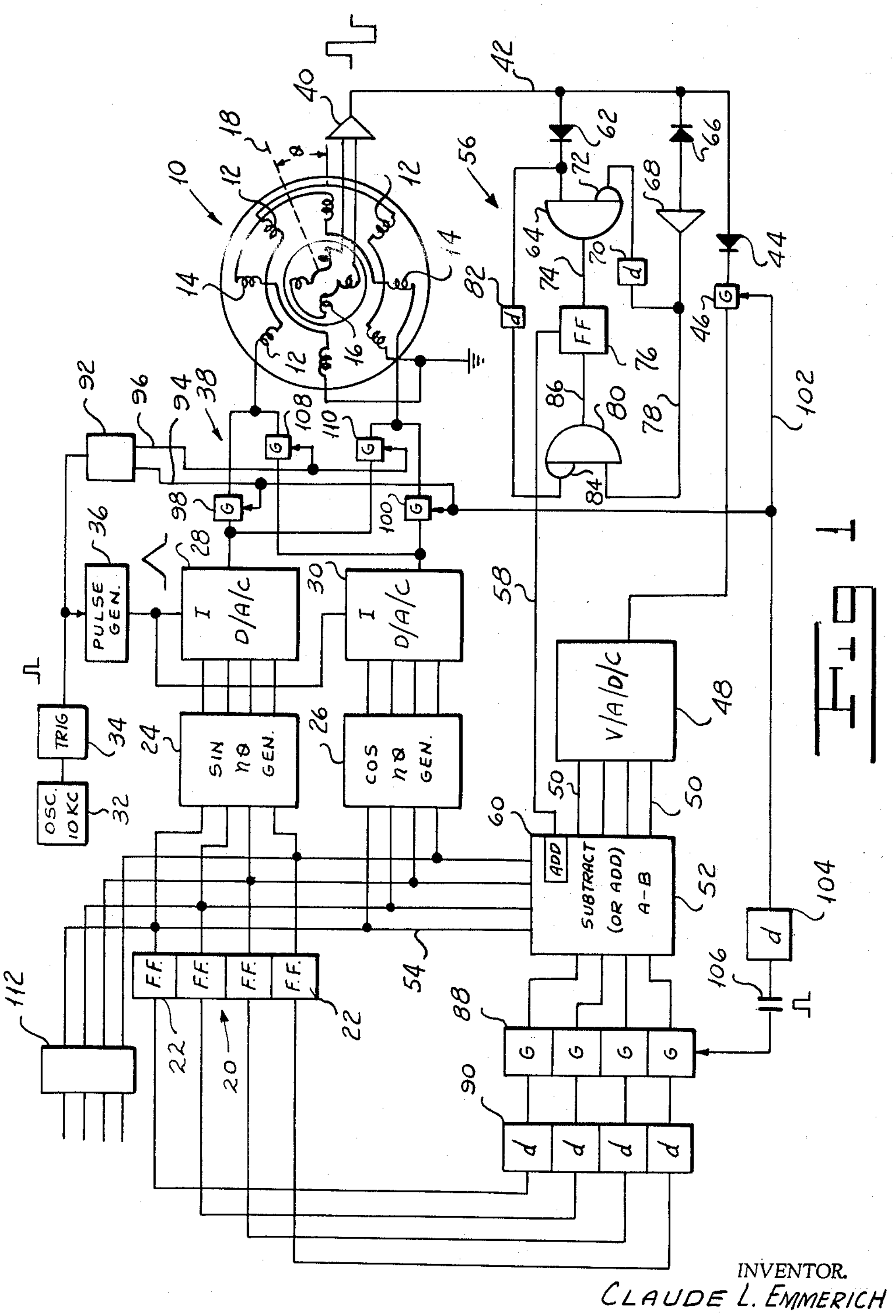
FIGURE 1 is a schematic view illustrating my digital resolver system.

Referring now more particularly to FIGURE 1 of the drawings, my system includes a multipole resolver or inductosyn, indicated generally by the reference character 10, having two stator windings one of which is represented by coils 12 and the other one of which is represented by coils 14. The rotor winding of the inductosyn is made up of a number of coils 16 and is adapted to be rotated by a shaft 18. As is known in the art, in the conventional resolver operation in response to a signal applied to the rotor winding made up by coils 16 the respective stator windings produce electrical output signals E sin $n\theta$ and E cos $n\theta$ where $\theta$ is the angular displacement of the shaft 18. As is pointed out hereinabove, in a multipole resolver or inductosyn the coupling between the rotor and stator windings is so low that the stator winding ouput signals are relatively small and must be amplified by amplifiers having relatively high gains. Not only is it required that the amplifiers have high gains but also they must be balanced if unwanted errors in the amplifier output signals are to be avoided.

In order to avoid the necessity for employing balanced output amplifiers in my inductosyn system, I apply respective pulses, the magnitudes of which are proportional to sin $n\theta$ and cos $n\theta$ to the respective stator windings of the inductosyn. In the course of operation of my system a register, indicated generally by the reference character 20, made up by a plurality of flip-flops 22 normally carries a digital representation of $n\theta$. I apply the output of the register 20 to respective look-up matrices or arbitrary function generators 24 and 26 adapted respectively to produce digital output representations of sin $n\theta$ and cos $n\theta$. I feed the digital outputs of the respective sine and cosine function generators 24 and 26 to current digital-to-analogue converters 28 and 30. As will be apparent from the description given hereinafter, the converters 28 and 30 are adapted to produce respective output pulses, the magnitudes of which are proportional to sin $n\theta$ and cos $n\theta$.

An oscillator 32 actuates a triggering pulse generator 34 which produces triggering pulses for controlling the operation of my system. For example, the oscillator may have an output frequency of 10$kc$ and may cause the triggering generator to produce output triggering pulses of a duration of one microsecond. I apply the triggering circuit output pulses to a pulse generator 36 which in response to the pulses from the circuit 34 produces a generally triangular wave form having a rise time of ten microseconds and a fall time of ten microseconds. The pulses from the generator 36 are fed to the converters 28 and 30 which in response to these pulses and to the digital inputs from generators 24 and 26 produce output pulses, the respective magnitudes of which are proportional to sin $n\theta$ and cos $n\theta$.

For a reason which will be apparent from the following description I employ a reversing gating arrangement, indicated generally by the reference character 38, for applying the output pulses from generators 28 and 30 respectively to the resolver sine winding made up by coils 12 and to the resolver cosine winding made up by coils 14. In response to the application of the sine representation pulse and the cosine representation pulse from converters 28 and 30 to the sine and cosine windings comprising the group of coils 12 and the group of coils 14 the rotor winding, including the coils 16, produces an output signal $\Delta n\theta$ proportional to the difference between the angle represented by the sine and cosine functions and the actual angular position of the shaft 18. An amplifier 40 having a high gain amplifies this signal and applies it to an output channel 42. While it is necessary in my system to employ an amplifier 40 having a relatively high gain, I need employ only one such amplifier so that there is no requirement for balancing two high gain amplifiers.

In response to the pulses applied to the inductosyn 10 it produces an output which is a positive-going pulse and a negative-going pulse. The magnitude of these pulses is a measure of the difference between the represented angle supply to the inductosyn and the actual angle of the shaft. The order in which the two ouput pulses appear is an indication of whether the actual angle is greater than the represented angle or whether the represented angle is greater than the actual angle. A circuit including a diode 44 and a gating circuit 46 applies the positive-going output pulse to a voltage analogue-to-digital converter 48 which digitizes the positive-going pulse to produce a digital output on channels 50 representing the magnitude of the difference between the actual angle and the represented angle. Channels 50 carry this output representation to the minuend input terminals of a subtraction circuit 52 which in its normal operation substracts the representation on channels 50 from the digital representation of the input angle which is applied to the subtrahend input terminals of the subtraction circuit by channels 54 leading from the flip-flops 22 to the circuit 52.

Where the actual angle is greater than the input angle, the difference representation must be added to the input representation. I employ a sign determining circuit, indicated generally by the reference character 56, which produces an output signal on a channel 58 when it is required that the difference be added to the input representation. Channel 58 is connected to a section 60 of the circuit 52 which causes the two inputs to the circuit to be added in response to the presence of a signal on the channel 58.

A diode 62 passes the positive-going pulse of the pair of output pulses from amplifier 40 to one input terminal of a two-input AND component 64. A reverse-biased diode 66 couples the negative-going pulse of the pair to an inverter 68, the output of which is applied by a delay network 70 to an inhibiting input terminal 72 of the AND circuit 64. As is known in the art, in response to the absence of an input pulse at terminal 72 and to the presence of an input at the other terminal of circuit 64 it produces an output signal on a channel 74. If the positive-going pulse of the output pulse pair from amplifier 40 occurs first it is necessary to add the difference representation on channels 50 to the input representation on channels 54. If the positive-going pulse thus occurs first it is immediately applied by diode 62 to the AND circuit 64 at a time when no input is applied to terminal 72 so that channel 74 carries an output which actuates a flip-flop 76 to produce a pulse on channel 58 to cause the circuit 52 to add the two inputs applied thereto. If, however, the negative-going pulse of the output pair from amplifier 40 appears first it is delayed by the circuit 70 for a period of time such that the inverted pulse is applied to the circuit 64 at the same time as the positive-going pulse so that the AND circuit produces no output on channel 74. To achieve this result, the delay provided by the circuit 70 may be, for example, ten microseconds.

I provide my circuit 56 with means for ensuring that no output exists on channel 58 when the circuit 52 is required to subtract the two inputs as it does in the normal course of its operation. A channel 78 applies the inverted negative pulse to one input terminal of a two input AND circuit 80. A delay circuit 82 providing a delay of ten microseconds, for example, applies the positive-going pulse to an inhibiting terminal 84 of the AND circuit 80. When the positive-going pulse occurs first its application to the terminal 84 is delayed by the circuit 82 until the inverted negative pulse is applied to the circuit 80 so that the circuit will produce no output on channel 86 and thus will not turn flip-flops 76 off. When, however, the negative-going pulse appears first indicating that there should be no signal on channel 58 so that the circuit 52 will subtract, the inverted negative pulse is immediately applied to AND circuit 80 to produce a signal on channel 86 which actuates flip-flop 76 to remove any signal which might have existed on channel 58.

From the structure thus far described it will be apparent that the subtracting circuit 52 produces an output signal which represents the correct value of $n\theta$. A plurality of gating circuits 88 are adapted to be actuated in a manner to be described to pass the output from the circuit 52 through a bank of delay circuits 90 to the flip-flops 22 of register 20 to set the register to the new value appearing on channels 54. This corrected output value passes through a calibrating circuit 112 to the output of my system.

From the structure thus far described it will readily be apparent that the output of my system is a fine indication of shaft position angle. In a system for producing a digital representation of the absolute angular position of shaft 18 I actuate a conventional resolver (not shown) in a manner analogous to that shown in FIGURE 1 in connection with the multipole resolver 10 to get a coarse indication of $\theta$. I combine this coarse indication with the fine indication produced by the system of FIGURE 1 by any suitable means to obtain a digital representation of absolute shaft position angle $\theta$. For example, I may combine the representations in the manner shown in the copending application of Manuel Selvin, Serial No. 148,208, filed October 27, 1961, for a Precision Analogue-to-Digital Converter.

I have discovered that in operation of my system the electrical energy converted to heat in the coils 12 and 14 in response to the application of pulses thereto is a function of the angular position of the shaft 18. This might result in an uneven temperature distribution with resulting mechanical distortion and corresponding errors in the output. My reversing gate arrangement 38 is actuated to apply pulses representing complementary angular settings to the coils 12 and 14 between reading pulses to obviate this result. The triggering pulses produced by the circuit 34 are applied to a scale-of-two counter 92 which alternately produces reading gating pulses on a channel 94 and compensating gating pulses on a channel 96. The reading gating pulses on channel 94 are applied to trigger gating circuits 98 and 100 to cause these circuits to pass the sine and cosine pulses respectively to the coils 12 of the sine input winding and to the coils 14 of the cosine input winding. This is the normal operation of my device. These reading gating pulses are applied by a channel 102 to the gating circuit 46 to pass the output positive difference pulse to converter 48 and through a delay circuit 104 and a pulse differentiated capacitor 106 to the bank of gates 88.

After a reading operation has taken place in response to a pulse on channel 94, a compensating pulse appears on channel 96 and actuates gates 108 and 110 to cause these gates respectively to apply the output from converter 30 to the coils 12 and to apply the output of converter 28 to the coils 14. From the description thus far given it will be apparent that the input pulse to the sine winding including coils 12 during a reading operation has an amplitude of A sin $n\theta$ and the input to the cosine winding including coils 14 at this time has a magnitude of $A$ cos $n\theta$. As is known in the art, in response to these signals the sine winding energy dissipation $A^2 \sin^2 n\theta$ and the cosine energy winding dissipation will be $A^2 \cos^2 n\theta$. Now, when the reversing gating arrangement 38 operates during the time of occurrence of a compensating pulse then the dissipation in the sine winding will be $A^2 \cos^2 n\theta$ and the dissipation in the cosine winding will be $A^2 \sin^2 n\theta$. Consequently, the over-all dissipation in each of the windings will be $$A^2 \sin^2 n\theta + A^2 \cos^2 n\theta = A^2$$

a constant. This arrangement permits of a check of the null condition of the system since during the compensating period the system will produce an output signal which can be checked by comparison with a computed value.

Figure 2:
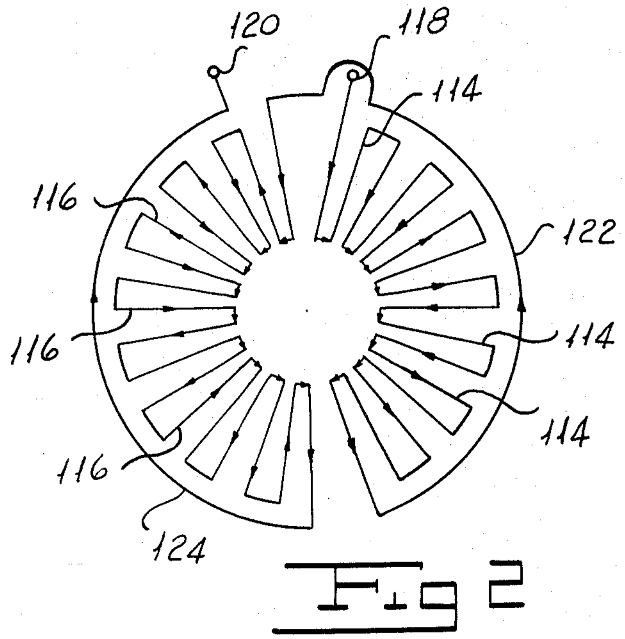
FIGURE 2 is a schematic view of one form of rotor winding which I may employ in my digital resolver system.

As is known in the art the multipole resolver or inductosyn is a precision device, the basic accuracy of which is derived from the precision and stability of an engraved circuit pattern on a pair of glass plates. In the conventional resolver rotor the pattern forming the rotor winding usually is one continuous circuit covering approximately 360°. Owing to the fact that the circuit forms a complete loop, a current flow therethrough may produce undesirable electromagnetic coupling with external circuits which, as is known in the art, are completed by slip rings and wiring passing through the center of the inductosyn. This effect is particularly pronounced in a pulsed system such as is illustrated in FIGURE 1 of the drawings. Referring now to FIGURE 2, I have shown one form of inductosyn rotor winding which obviates this undesirable effect. In this construction I effectively split the rotor winding into two parts. The first section of the rotor winding includes a plurality of rotor winding conductor lines 114 connected in series between one of the terminals 118 and a conductor 122. Assuming for purposes of illustration that the terminal 118 is positive, a current flow in the direction of the arrows shown in the figure will be produced in the series circuit including conductors 114.

The other section of the rotor shown in FIGURE 2 includes a plurality of conductive lines 116 connected in series between conductor 122 and a conductor 124 leading to the other terminal 120 which for purposes of explanation is assumed to be negative. As a result of these connections a current flow in the direction of the arrows shown in FIGURE 2 is produced in conductors 116. It will readily be appreciated that the flux resulting from current flowing through the rotor winding in the direction of the arrows shown in FIGURE 2 substantially cancels out so that any coupling with other circuit components is negligible.

Figure 3:
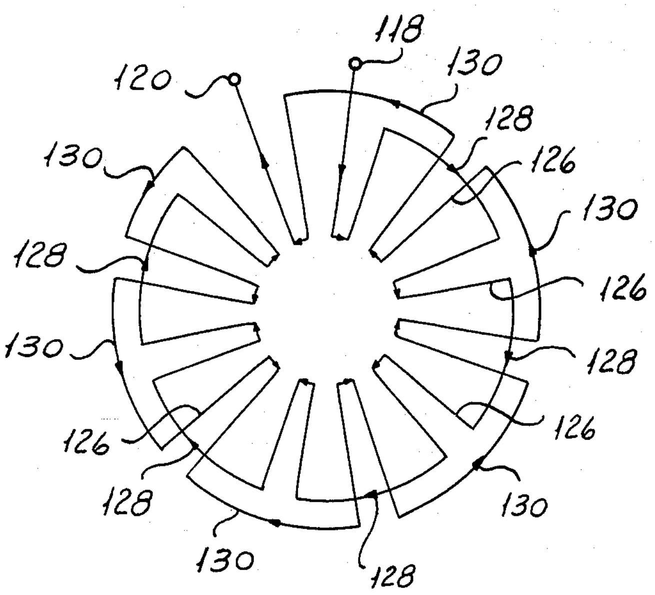
FIGURE 3 is a schematic view of an alternate form of rotor winding I may employ in my digital resolver system.

Referring now to FIGURE 3, I have shown an alternative arrangement in which I divide the conductors 126 making up the rotor winding into two groups. The first group of conductors 126 making up the rotor coils is connected in series between the terminal 118 and a conductor 130 leading back to the conductors making up the other group by conductors 128. Conductors 130 connect the conductors 126 of the second group in series between the last conductor 126 of the first group and terminal 120. It will readily be apparent from the FIGURE that a pair of conductors of the first group is disposed between two pairs of conductors of the second group so that the canceling flux is distributed around the rotor alternately in one direction and then in the other as will be apparent from the current arrows in the figure.

In operation of the form of my digital resolver system the flip-flops 22 carry a representation of an initial angle $n\theta$ which is fed through the sine function generator 24 and the cosine function generator 26 to the converters 28 and 30. Assuming that this value has just changed and that a pulse appears on channel 94, gates 98 and 100 are actuated to pass the output pulses, from converters 28 and 30, respectively representing by their magnitudes sin $n\theta$ and cos $n\theta$ to the sine winding including coils 12 and to the cosine winding including coils 14. In response to these inputs and assuming that the actual shaft angle is different from the value represented by the condition of storage flip-flops 22, amplifier 40 produces an output which is a positive-going pulse and a negative-going pulse, the magnitude of each of which is proportional to the difference between the actual angular position and the initial position.

Diode 44 passes the positive-going pulse to a gate 46 which also is actuated by the reading pulse on channel 94 to conduct this pulse to the voltage analogue-to-digital converter 48. In response to this pulse converter 48 produces on channels 50 a digital representation of the angle difference. If the negative-going pulse of the output of amplifier 40 occurs first it is inverted by inverter 68 and passed through a delay circuit 70 to the inhibiting input terminal 72 of AND circuit 64. As is explained hereinabove, circuit 70 provides a delay which is substantially equal to the duration of one output pulse of amplifier 40 so that in the case under consideration the inverted negative-going pulse is applied to this circuit and no output appears on channel 74 to actuate flip-flop 76 to cause circuit 52 to add.

Channel 78 passes the inverted negative-going pulse to circuit 80 substantially instantaneously so that this AND circuit produces an output since the positive-going pulse not only occurs later but also is delayed by the circuit 82. Consequently, channel 86 carries an output which ensures that flip-flop 76 is set in a condition in which channel 58 carries no output.

Where the positive-going pulse of the output of amplifier 40 occurs first indicating that circuit 52 should add the inputs thereto, this pulse is applied to circuit 64 before the inverted and delayed later-occurring negative-going pulse reaches the inhibiting input terminal 72 so that channel 74 carries an output which sets flip-flop 76 to a condition at which channel 58 carries an output which causes circuit 52 to add the two inputs thereto. At the same time the delayed positive pulse passes through network 82 and is applied to the inhibiting terminal 84 of AND circuit 80 concomitantly with the application of the negative-going pulse to the circuit 80 so that this circuit does not produce a signal for resetting flip-flop 76.

In accordance with the order of occurrence of the positive-going and negative-going output pulses from amplifier 40, circuit 52 subtracts or adds the initial angular position representation on channels 54 and the difference angular position representation on channels 50 to produce an output representing the actual angular position of rotor shaft 18. This representation is applied to the gating circuits 88. A delay network 104 passes the reading pulse on channel 102 through a pulse sharpening capacitor 106 to the triggering input terminal of gating circuits 88 after a delay sufficient to permit the subtracting circuit 52 to operate. This delay may, for example, be eight microseconds. Delay networks 90 providing a delay of, for example, three microseconds, which is greater than the duration such as one microsecond of the pulse applied to the gating circuits 88, pass the actual angular representation to the register including flip-flops 22 to set the flip-flops to the new value of $n\theta$ which passes out through the calibrating circuit 112 to the output of the system. As has been explained hereinabove, this output may be combined with a coarse digital representation of $\theta$ produced by a conventional resolver operated in a manner analogous to that in which multipole resolver 10 is operated to give a precise digital representation of shaft position angle.

The next output pulse from counter 92 occurs on channel 96 to actuate gates 108 and 110 to apply the cosine pulse representation to the sine winding including coils 12 and to pass the sine pulse representation to the cosine winding including coils 14. As will be apparent from the explanation given hereinabove, this action causes the power dissipation in the inductosyn 10 to be constant. Preferably, I employ a rotor winding arrangement such as is shown in either of FIGURES 2 or 3 to obviate undesirable electromagnetic coupling between the rotor winding and external circuit components.

It will be seen that I have accomplished the objects of my invention. I have produced a multipole system which produces an accurate digital representation of shaft position angle. My system is especially adapted for use in cases in which code wheel converters cannot successfully be employed. My system does not require the use of balanced high gain amplifiers in the resolver output circuit. It is simple and inexpensive to produce. The gain of the resolver output amplifier of my system need not be stabilized. My system is arranged to permit the use of relatively high voltage levels so that the signal-to-noise ratio of my system is high. I provide my system with means for ensuring relatively constant power dissipation and with means for preventing the undesired electromagnetic coupling between the resolver rotor and the external circuit.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A resolver system including in combination a resolver having first and second input windings and an output winding and means comprising a shaft for rotating said input windings and said output winding relative to each other whereby said shaft has an actual position angle, means for generating a pair of signals having magnitudes respectively proportional to the sine of an input angle and to the cosine of an input angle, means for producing a gating pulse and an auxiliary gating pulse, means responsive to said gating pulse for applying said signals with magnitude proportional to the sine and to the cosine of an input angle respectively to said first and second input windings, means responsive to said auxiliary gating pulse for applying said signals having magnitudes proportional to the sine and to the cosine of an input angle respectively to said second and first input windings, said output winding producing a signal indicating the difference angle between said input angle and the actual position of said shaft and means responsive to said difference angle signal for producing an indication of the actual position angle.

2. A resolver system including in combination a resolver having first and second input windings and an output winding and means comprising a shaft for rotating said input windings and said output winding relative to each other whereby said shaft has an actual position angle, means for generating a pair of triangular current pulses having magnitudes respectively proportional to the sine and to the cosine of an input angle, means for simultaneously applying said pulses respectively to the first and second input windings to cause said output winding to produce a rectangular output voltage pulse having positive and negative half cycles the order of which half cycles indicates the sign of said difference and means responsive to said rectangular output voltage pulse for actuating said pulse generating means.

3. A resolver system including in combination a resolver having first and second input windings and an output winding and means comprising a shaft for rotating said input windings and said output winding relative to each other whereby said shaft has an actual position angle, said output winding being adapted to produce an analogue output signal in response to signals applied to said input windings and in response to the position of said shaft, means for converting said analogue output signal to a proportional digital representation thereof, means for integrating the digital representations of said analogue output signal to produce a representation of assumed angular position of said shaft, means responsive to said integrating means for producing signals representing the magnitudes of the sine and cosine of said assumed angular position and means for applying said sine and cosine magnitude representing signals respectively to said first and second input windings.

4. A resolver system including in combination a resolver having first and second input windings and an output winding and means comprising a shaft for rotating said input windings and said output winding relative to each other whereby said shaft has an actual position angle, means for generating a pair of triangular current pulses having magnitudes respectively proportional to the sine and to the cosine of an input angle, means for simultaneously applying said pulses respectively to the first and second input windings to cause said output winding to produce a rectangular output voltage pulse having positive and negative half cycles the magnitude of each of which indicates the magnitude of the difference between the input angle and the actual position angle of said shaft and the order of which indicates the sign of said difference, means responsive to said output pulse for producing a digital representation of the magnitude of said half cycles, means for determining the order of said half cycles and means responsive to said digital representation producing means and to said order determining means for integrating the digital representation of said half cycle magnitude to produce a representation of assumed angular position of said shaft and means for applying said representation of assumed angular position of said shaft to said pulse generating means.

References Cited by the Examiner

UNITED STATES PATENTS

| | | | |
|---|---|---|---|
| 2,799,835 | 7/1957 | Tripp et al. | 340—196 |
| 2,900,612 | 8/1957 | Tripp | 336—200 |
| 2,915,721 | 12/1959 | Farrand et al. | 336—200 |
| 2,921,280 | 1/1960 | Litwin et al. | 336—200 |
| 3,045,230 | 7/1962 | Tripp | 340—347 |
| 3,148,325 | 9/1964 | Burk | 340—196 |
| 3,148,347 | 9/1964 | Morrisson | 336—200 |

MALCOLM A. MORRISON, *Primary Examiner.*